US006650426B1

United States Patent
Zalicki

(10) Patent No.: US 6,650,426 B1
(45) Date of Patent: Nov. 18, 2003

(54) ENDPOINT DETERMINATION FOR RECESS ETCHING TO A PRECISE DEPTH

(75) Inventor: Piotr S. Zalicki, Sunnyvale, CA (US)

(73) Assignee: SC Technology, Inc., Fremont, CA (US)

( * ) Notice: Subject to any disclaimer, the term of this patent is extended or adjusted under 35 U.S.C. 154(b) by 220 days.

(21) Appl. No.: 09/614,112

(22) Filed: Jul. 12, 2000

Related U.S. Application Data
(60) Provisional application No. 60/143,351, filed on Jul. 12, 1999.

(51) Int. Cl.$^7$ ............................................. G01B 11/02
(52) U.S. Cl. ....................................... 356/626; 356/496
(58) Field of Search ................................. 356/626, 496

(56) References Cited

U.S. PATENT DOCUMENTS

| | | | | |
|---|---|---|---|---|
| 4,618,262 A | * | 10/1986 | Maydan et al. ............. | 356/504 |
| 4,674,883 A | | 6/1987 | Baurschmidt ................ | 356/381 |
| 5,212,454 A | | 5/1993 | Probsting .................... | 324/687 |
| 5,341,205 A | | 8/1994 | McLandrich et al. ....... | 356/73.1 |
| 5,452,953 A | | 9/1995 | Ledger ......................... | 356/382 |
| 5,563,084 A | | 10/1996 | Ramm et al. ................. | 437/51 |
| 5,691,540 A | * | 11/1997 | Halle et al. .................. | 356/496 |
| 5,807,761 A | * | 9/1998 | Coronel et al. .............. | 438/14 |

OTHER PUBLICATIONS

"A Virtual Interface Method For Extracting Growth Rates and High Temperature Optical Constants from Thin Semiconductor Films Using in situ Normal Incidence Reflectance", W.G. Breiland and K.P. Killeen, Journal of Applied Physics, vol. 78, No. 11, American Institute of Physics, Dec. 1995.

"Trench Dept Measurement System form CLSI RAM's Capacitor Cells Using Optical Fiber and Michelson Interferometer", K. Takada, K. Chida, J. Noda, and S. Nakajima, Journal of Lightwave Technology, vol. LT–5, No. 7, IEEE/OSA, Jul. 1987.

"Optical Diagnostics for Thin Film Processing", Irving P. Herman, Academic Press (1996).

* cited by examiner

*Primary Examiner*—Richard A. Rosenberger
(74) *Attorney, Agent, or Firm*—Gray Cary Ware & Freidenrich, LLP; Andrew V. Smith

(57) ABSTRACT

A method for plasma etching a shallow recess or shallow trench at a predetermined depth by illuminating a wafer with a light source and using a spectrometer to receive the light reflected from the wafer begins with a step of detecting an etch start time, either by detecting a time of plasma ignition, as extracted from reflectance data, or a time extracted from the reflectance data when a wafer reflectance signal is observed to begin to change after a residual layer is etched away prior to beginning a recess or trench etch. The next step is measuring a reflectance intensity of light reflected from the wafer. Preferably, a plasma background signal is removed from this measurement and an array detector is used wherein the wavelength is determined using the reflectance model. Next, an etch rate is determined by fitting data representing the collected reflectance signal to the wafer reflectance model as a function of time, and extracting the etch rate from the model. The model preferably takes into account each of a weakening of the reflectance signal as the recess or trench becomes deeper, any residual oxide layer breakthrough step performed prior to etching the recess or trench and preferably as well any etching of the mask or top reference layer. An etch stop time is determined based on the etch rate, the etch start time and the predetermined recess or trench depth. Preferably, a software timer will then trigger the endpoint such that etching is stopped at the determined etch stop time.

63 Claims, 12 Drawing Sheets

ENDPOINT DETERMINATION FOR RECESS ETCHING TO A PRECISE DEPTH

PRIORITY

This application claims the benefit of priority to U.S. provisional patent application No. 60/143,351, filed Jul. 12, 1999, which is hereby incorporated by reference.

BACKGROUND OF THE INVENTION

1. Field of the Invention

The invention relates to plasma etching of shallow recesses, and particularly to precise endpoint determination for stopping the etching at the desired recess depth.

2. Discussion of the Related Art

Poly recess on oxide processing is a technique wherein etching of the recess to an accurate depth is desired. Recess structures are first etched typically into an oxide or a nitride layer, or both, which may be over a wafer or a thick layer of poly. The etch typically does not invade the substrate as is typically the case for deep trench etching processes. Next, an oxide liner may be grown within the recess. A layer of poly is then deposited onto the oxide to both fill the recesses and to form a planar layer of poly over the oxide. A subsequent etch then first strips away the planar poly. Then, both the oxide and the poly filling the recesses is etched. It is desired to have a technique for accurately etching a shallow recess to a precise depth.

FIG. 1 schematically shows a collimator section 39 of a monitoring apparatus of an etch treatment reaction chamber 22, which is described in U.S. Pat. No. 5,807,761, which is hereby incorporated by reference into the present application. The reaction chamber 22 is provided with a top view port 26 disposed above a wafer 24 and in parallel relationship therewith. When plasma processing is performed using the chamber 22 of the '761 application, a light beam having a specified wavelength L is applied to the wafer 24 through the view port 26 via an optical cable 30 and a lens 31. This lens 31 produces a parallel light beam, which illuminates a relatively large area of the wafer 24 at a substantially normal angle of incidence. The reflected beam is focused by the lens 31 and transported via another optical cable 32 to a spectrometer (not shown) tuned on this wavelength L.

The analog signal that is output from this spectrometer is illustrative of the interferences of the reflected light. The depth of a recess etched into the wafer 24 may be determined based on the measured interference pattern.

In the '761 patent, a digitized optical signal S is filtered to reveal two components: S1 that is illustrative of the re-deposition of etched material outside the trench and S2 that is illustrative of the trench etching. The signal S can be separated into two frequency components S1 and S2 because the trench depth is much larger than the wavelength of light and the signal S includes many periods of the interferometric oscillations.

The technique described in the '761 patent relates to a method of real time and in-situ monitoring of deep trench depths. That is, the deep trenches of the '761 patent have depths much larger than the wavelength of the monitoring light source ($\lambda$<<trench depth). Moreover, these deep trenches have diameters far larger than the diameters of shallow poly recesses.

Depths of deep trenches may vary by a larger absolute depth variance than would be tolerable for a shallow recess. For example, if a depth tolerance of 6% is desired for both the deep trenches (~10 $\mu$m) of the '761 patent and for shallower poly recesses (~600 nm), then the deep trenches may be etched to depths between 9.4 $\mu$m and 10.6 $\mu$m, or somewhere in a 1.2 $\mu$m range, whereas the shallow recesses may be etched to depths between the narrower range of 564 nm to 636 nm, or a rnage of only 72 nm. Thus, in order for each process to achieve depths within the desired tolerance of, e.g., 6%, the shallow recesses must be etched with an absolute accuracy of depth around 15–20 times greater than for the deep trenches. It is desired to have a technique for achieving this higher degree of absolute shallow recess etch depth accuracy.

SUMMARY OF THE INVENTION

It is therefore an object of the invention to have a technique for accurately etching a shallow recess to a precise depth. It is a further object to have a technique for achieving a much higher degree of absolute shallow recess etch depth accuracy than is needed for deep trench etching.

In accord with the above objects, a method is provided for plasma etching a shallow recess at a precise depth by illuminating a wafer with a light source and using a spectrometer to receive the light reflected from the wafer. The method begins with a step of detecting the etch start time, preferably by detecting the time of plasma ignition out of measured reflectance data. Alternatively, a step of detecting the time when the wafer reflectance signal begins to change will be performed when etching is not started at the time of plasma ignition, e.g., when an oxide layer is etched by the plasma prior to etching the recess. The precise etch start time is preferably extracted from the reflectance data which exhibits a sharp rise at the time of plasma ignition, and then again after breaking through any residual oxide.

The next step is measuring the reflectance intensity of light reflected from the wafer. Preferably the plasma background signal is removed from this measurement and an array detector is used wherein the wavelength is determined using software analysis.

Next, a step of determining the etch rate is performed preferably by fitting data representing the collected reflectance signal to a wafer reflectance model as a function of time, and extracting the etch rate from the model. The model preferably takes into account a weakening of the reflectance signal as the recess becomes deeper, and preferably as well any etching of the mask or top reference layer.

Last, an etch stop time is determined based on the etch rate, the etch start time and the predetermined etch depth. Preferably, a software timer will then trigger the endpoint such that etching is stopped at the etch stop time.

A breakthrough step may be performed wherein a residual layer such as an oxide layer is first etched away prior to beginning the recess etching process. The software would take into account the etching away of this residual layer or layers above the recess, such that an etch start time would begin after plasma ignition and the etching away of the residual layer.

Preferably, an array spectrometer is used for detecting the reflected light from the wafer. Also preferably, wavelength selection is performed in the analysis software. Also preferably, a substantially exponential reduction in reflectance intensity based on the depth of the recess is taken into account in the reflectance model used in the analysis software. Also preferably, a chamber window is used that is not exactly parallel to the wafer surface so that light reflected from the window is not collected.

DETAILED DESCRIPTION OF THE PREFERRED EMBODIMENT

Figure 1:
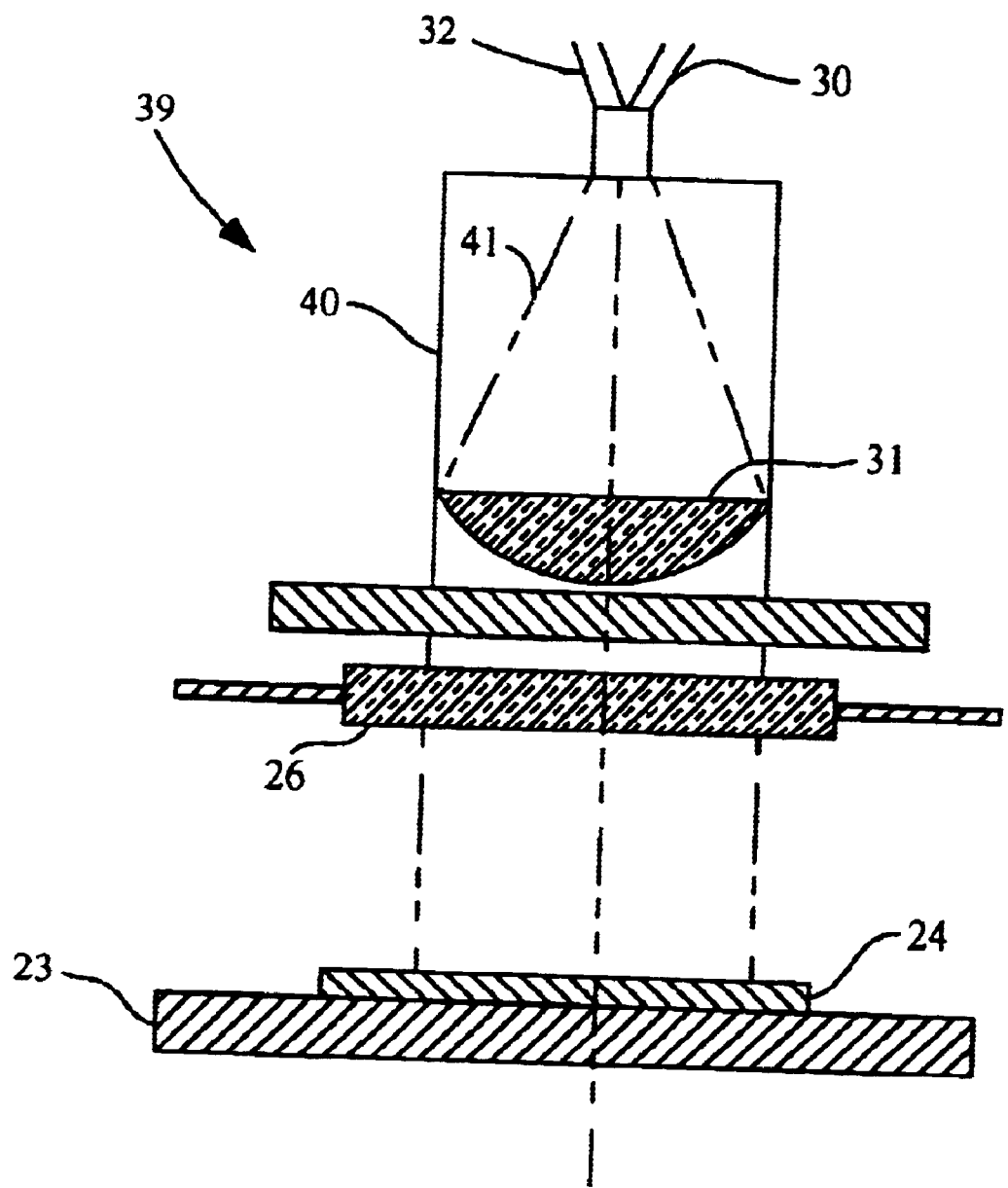
FIG. 1 schematically shows a collimator section 39 of a monitoring apparatus of an etch treatment reaction chamber 22, which is described in the U.S. Pat. No. 5,807,761.
Figure 2A:
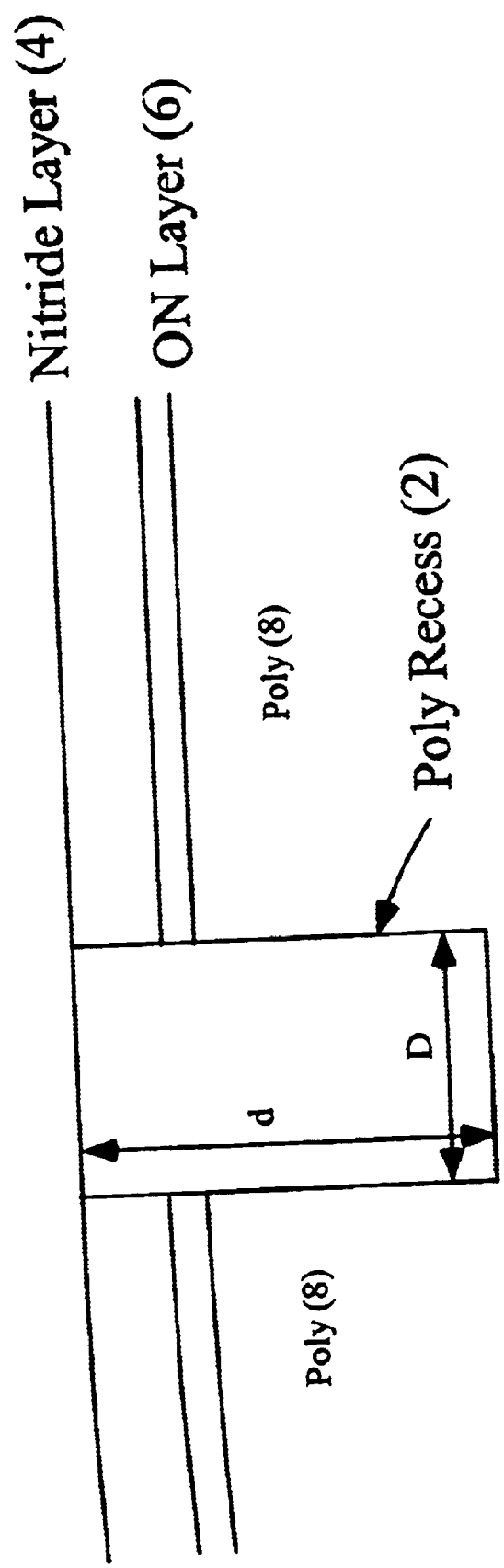
FIG. 2a schematically shows a wafer structure including a poly recess.

FIG. 2a shows a typical wafer structure including a poly recess 2. The poly recess 2 is shown etched into a nitride layer 4 which is over an ON layer 6. The poly recess 2 shown extends beneath the nitride and ON layers 4, 6 into the poly 8. At this point, further processing might include growing or depositing a dielectric or oxide liner within the recess 6, followed by filling the recess with poly, e.g., to form a capacitive device.

Figure 2B:
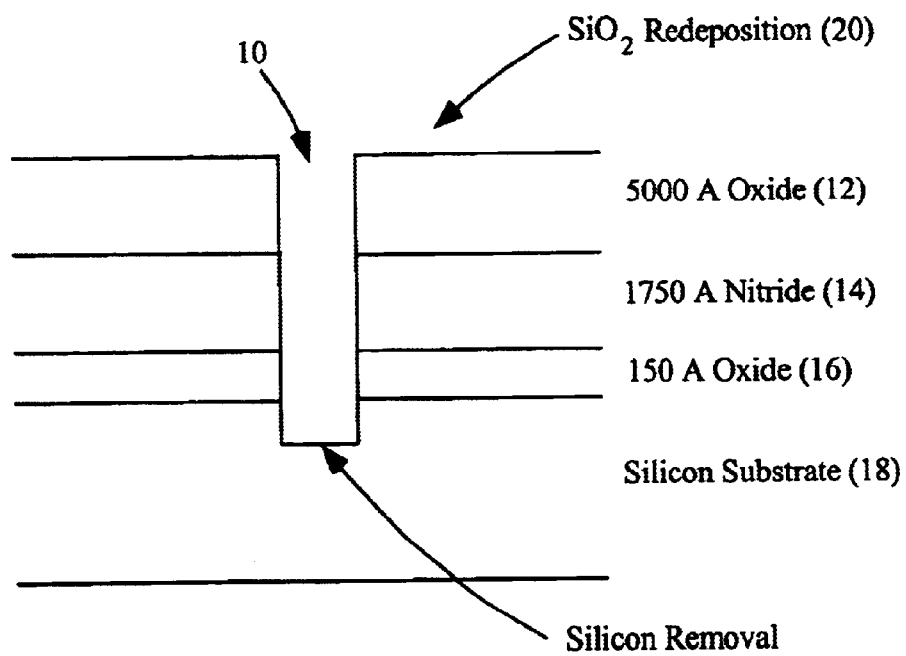
FIG. 2b schematically shows a wafer structure including a deep trench.
Figure 2C:
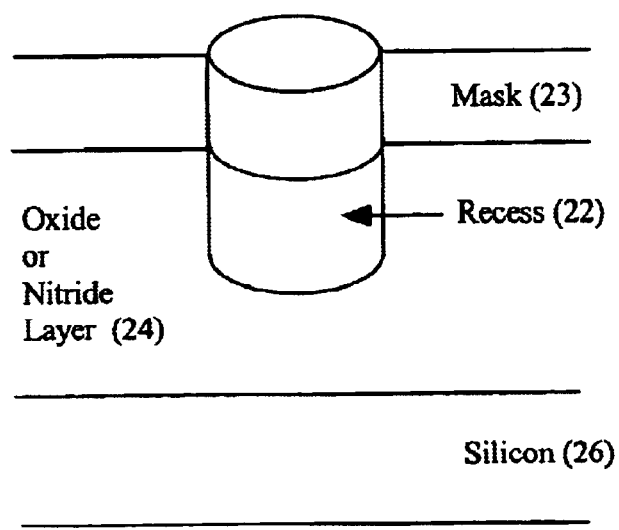
FIG. 2c schematically shows another wafer structure including a shallow recess in an oxide or nitride layer.

FIGS. 2b–2c illustrate differences between deep trenches and shallow recesses. FIG. 2b schematically illustrates a deep trench 10 etched into a process structure, while FIG. 2c schematically illustrates a shallow recess etched into a process structure.

The deep trench 10 of FIG. 2b is shown formed in a layer structure including an oxide mask 12, a nitride layer 14, and a thin second oxide layer 16. The deep trench 10 is shown formed into the silicon substrate 18. A layer of redeposited silicon dioxide 20 is also indicated as being deposited over the oxide 12 during the etching of the trench.

The shallow recess 22 of FIG. 2c is shown formed through a mask 23 and into an oxide or nitride layer 24. Notably, the shallow recess 22 is typically not formed into the silicon substrate 26.

Figure 3:
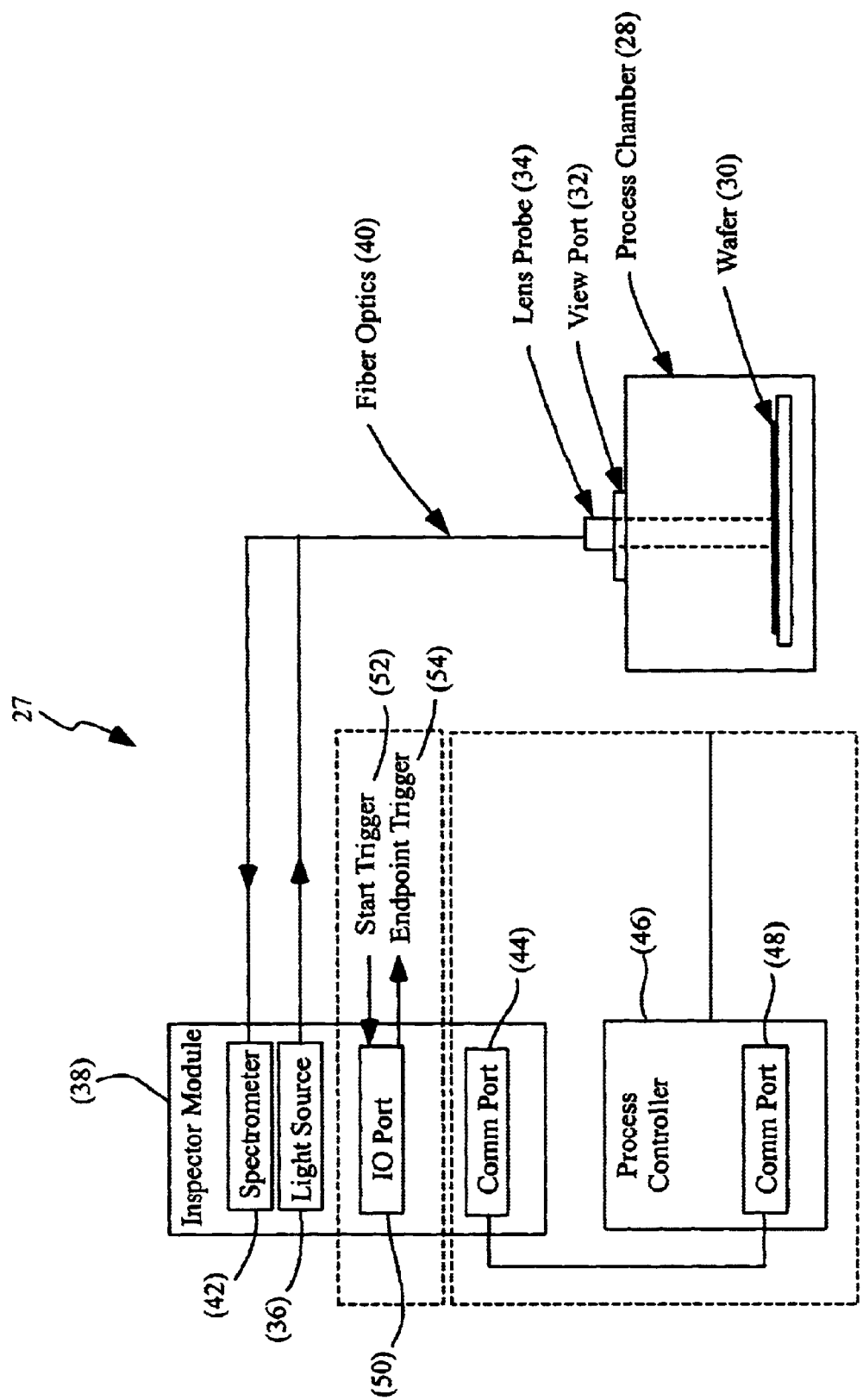
FIG. 3 schematically shows a preferred hardware configuration for etching a shallow recess or shallow trench to a precise depth.

An endpoint detector hardware configuration 27 in accord with a preferred embodiment is schematically shown in FIG. 3. A process chamber 28 contains a wafer 30 having a process structure thereon. A view port 32 allows optical access to the interior of the chamber 28 including the wafer 30. A lens probe 34 directs light from a light source 36 within an inspector module 38 via a fiber optics 40. The lens probe 34 also collects light reflected from the wafer 30. The reflected light is then transmitted through the fiber optics 40, which include either separate optical fiber cables or a single bi-directional cable, and into a spectrometer 42.

The inspector module 38 includes a comm port 44 for communicating with a process controller 46 via a comm port 48 of the process controller 46. A software program running preferably on the inspector module 38, but alternatively on the process controller 46, calculates an endpoint for the shallow recess etching process. The inspector module 38 also has an I/O port 50 which receives a start trigger 52 for beginning optical measurements and an endpoint trigger 54 for triggering the stopping of the plasma etching, i.e., by triggering the quenching of the plasma.

The endpoint detector 27 in accord with the preferred embodiment of the present invention has been developed for accurate endpoint etching of recess 3, recess 2, and CB recesses. Each of these shallow recess types is a small, typically circular, well 2,22 on the surface of a wafer 26. A typical recess diameter D is less than about 0.5 µm and typically around 0.3 µm, and the depth d varies from around 1500 Angstroms to several thousands of Angstroms depending on the recess type. The small diameter D of the recess is contrasted with a typically much larger width or length of a deep trench. The shallow depth d of the recess is contrasted with a far larger depth of a deep trench (e.g., ~10 µm).

Figure 4:
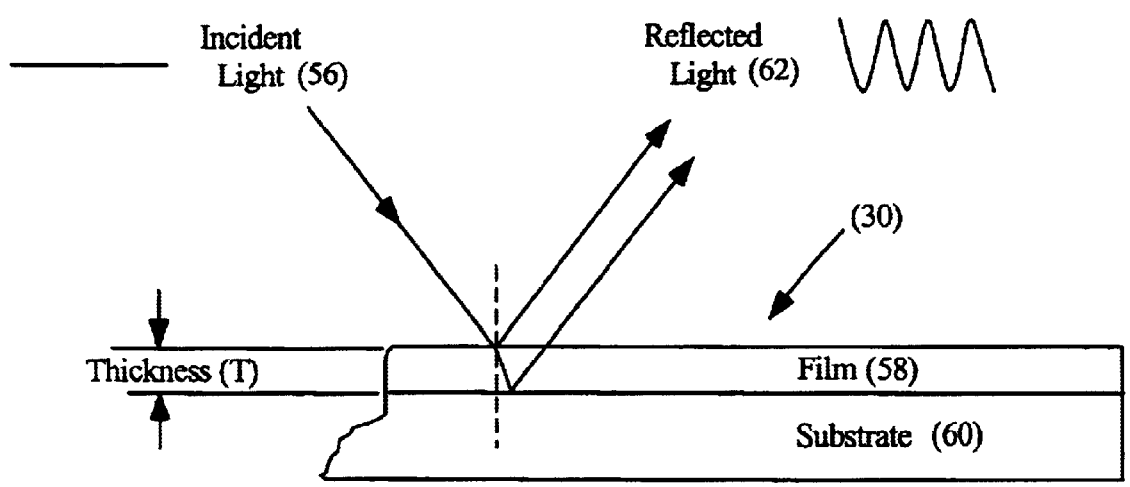
FIG. 4 schematically shows how incident light is reflected from a layer structure on a silicon substrate.

FIG. 4 illustrates the principle of using a reflectance model for fitting reflectivity data to determine an endpoint for a shallow recess etch. Incident light of wavelength λ is illuminated onto the wafer 30. Some of the light 56 is reflected at the surface of the film 58 over the substrate 60, and some of the light is reflected at the surface of the substrate 60. Reflected light 62 is then detected and an interference pattern is observed, based on superposition of rays reflected from the substrate 60 and the film 58, which is dependent on the thickness T of the film, i.e., or the depth of a recess being formed in the film. The period of the interference pattern generally depends on the depth of the etch process.

The recess depth measured in the preferred embodiment is on the order of and may be less than the wavelength of light from the light source used to collect reflectance data for making is-situ depth determinations. For example, light of wavelength 365 nm may be used. The recess depth is measured by fitting a wafer reflectance model to the wafer reflectance as a function of time. The reflectance model would be based on the dependence of the reflectivity function R on the film thickness T, wavelength of source light λ and refractive indices of the substrate $n_{substrate}$ and the film $n_{film}$ above the substrate, i.e., R (thickness, $n_{substrate}$, $n_{film}$, λ). Since the refractive indices $n_{substrate}$, $n_{film}$ are known for the materials involved, and the wavelength λ of the incident light is known, the thickness can be calculated from the measured reflectance data. The reflectance model may also take into account such factors as effects of wafer topography, plasma background, signal extinction and/or viewport clouding. Additional features of the preferred reflectance model are set forth below with respect to the preferred method of the invention.

The reflectance model is fundamentally derived from the Fresnel equations for an optical ray incident at an interface between media having refractive indices $n_1$ and $n_2$:

$$r_{12}=(n_1-n_2)/(n_1+n_2).$$

For a single layer film of refracive index $n_2$ and thickness d between materials of refractive indices $n_1$ and $n_3$, a film reflection coefficient may be written as:

$$r_{123}=(r_{12}+r_{23}e^{i4\lambda(n2)d})/(1+r_{12}r_{23}e^{i4\lambda(n2)d});$$

where (n2) in the argument of the exponential is $n_2$, or the refractive index of the film. For a layer structure, a more complex reflection coefficient would be used such as are set forth at Breilan, W. G., et al., Journal of Applied Physics, vol. 78, pp. 6726–36 (1995) and Irving P. Herman, Optical Diagnostics for Thin Film Processing, Academic Press (1996), each of which is hereby incorporated by reference.

More specifically, the recess etch signal intensity I is preferably modeled as follows:

$$I=I_0+I_1*\Delta t+I_2*e^{-\gamma\Delta t}\sin(\phi*\Delta t),$$

where $I_0$ is the baseline signal intensity; $I_1*\Delta t$ describes change in the baseline caused, for example, by etching of the top layer (hard mask) at a rate much slower than the recess etch; and $e^{-\gamma\Delta t}\sin(\phi*\Delta t)$ describes the change in the signal intensity with the recess depth caused by the interference between the light components reflected of the top and the bottom of the recess.

In the above equation $e^{-\gamma\Delta t}$ represents the decay of the signal with the increase of the recess depth, and $\phi$ is the phase difference between the light components reflected of the top and the bottom of the recess: $\phi=\phi_0+\phi_1*\Delta t+\phi_1*\Delta t^2+\phi_1*\Delta t^3$. The time dependence of the phase is given in a form of the Taylor's expansion, and higher orders of the expansion can be set to zero if are negligibly small. $\Delta t=t-t_0$ to is the time elapsed from the etch start time $t_0$.

The recess rate is preferably derived as:

$$\rho=\text{etch selectivity}*\lambda/4\pi*(\phi-\phi_0)/\Delta t.$$

A preferred measurement sequence is as follows:

1. Detect the etching start time $t_0$. This is preferably accomplished by optically detecting the plasma ignition time. The plasma ignition time and the time when the plasma is switched on can very greatly between any two plasma ignitions. Thus, obtaining the plasma ignition from the reflectance data is more precise than using the time the plasma is mechanically/electrically switched on. However, if the plasma ignition time is different from the etch start time $t_0$, then the detection of the beginning of a wafer reflectance change is preferably used as the etch start time $t_0$. The latter case may arise if etching does not start immediately after the plasma ignition due to the presence of a residual layer, such as an oxide or other layer or combination of layers, being originally formed over the wafer. In this case, the plasma first etches the residual layer away in a "breakthrough" step, and then after that the plasma begins to etch the recess. If the plasma ignition time were used in this latter case as the etch start time, an erroneous recess depth determination would result.

The etch start time may alternatively be another time wherein the recess depth is substantially known. That is, although the recess depth is known to be zero in the preferred embodiment when either the plasma is ignited or after the residual oxide layer is etched away, there may be other times when the recess is partially etched and the depth is known within a sufficient tolerance such that the etch stop time may be calculated. In this case, the depth of the recess at some time during the etching of the recess may be calculated using a reflectance model similar to that used in the preferred embodiment, as set forth above, or as set forth in the '462 application, or otherwise as may be understood by one skilled in the art. Then, using the etch rate and the known etch depth at the etch start time, whether that depth is nearly zero, nearly the selected final or predetermined etch depth, or somewhere in between, the etch stop time can be calculated. Thus, the etch start time may be other than at zero recess depth.

2. Measure the intensity of light reflected from the wafer. The plasma background is preferably advantageously removed from the signal. Preferably, plasma background removal is performed observation of the spectra obtained when the light source is on and when the light source is off. The plasma background could be later subtracted from reflectance measurements. Other approaches are understood by those skilled in the art.

Figure 5A:
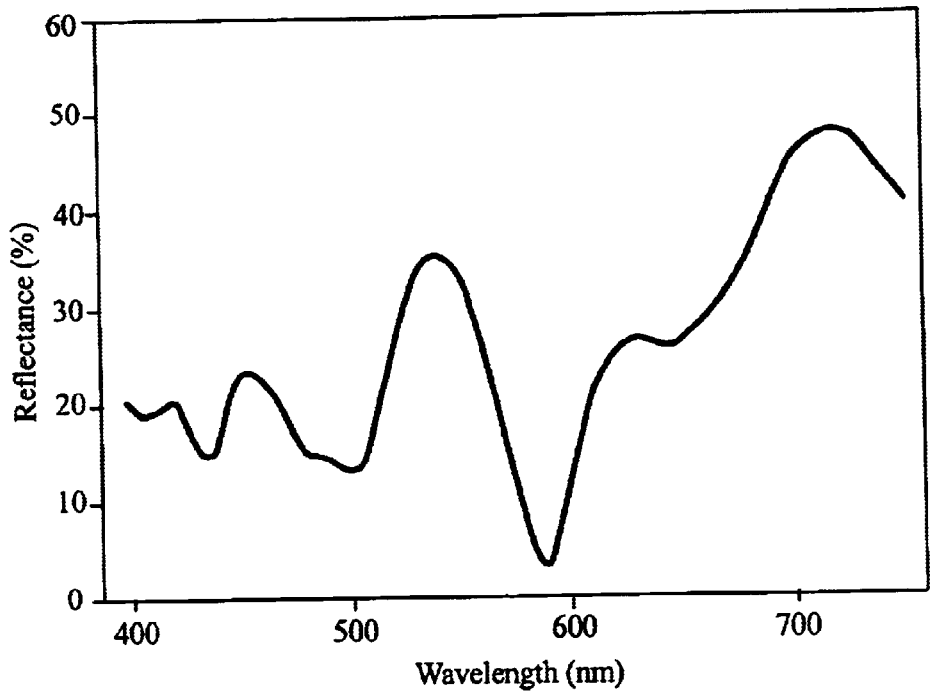
FIG. 5a shows a reflectance signal versus wavelength measured in accord with the preferred embodiment.
Figure 5B:
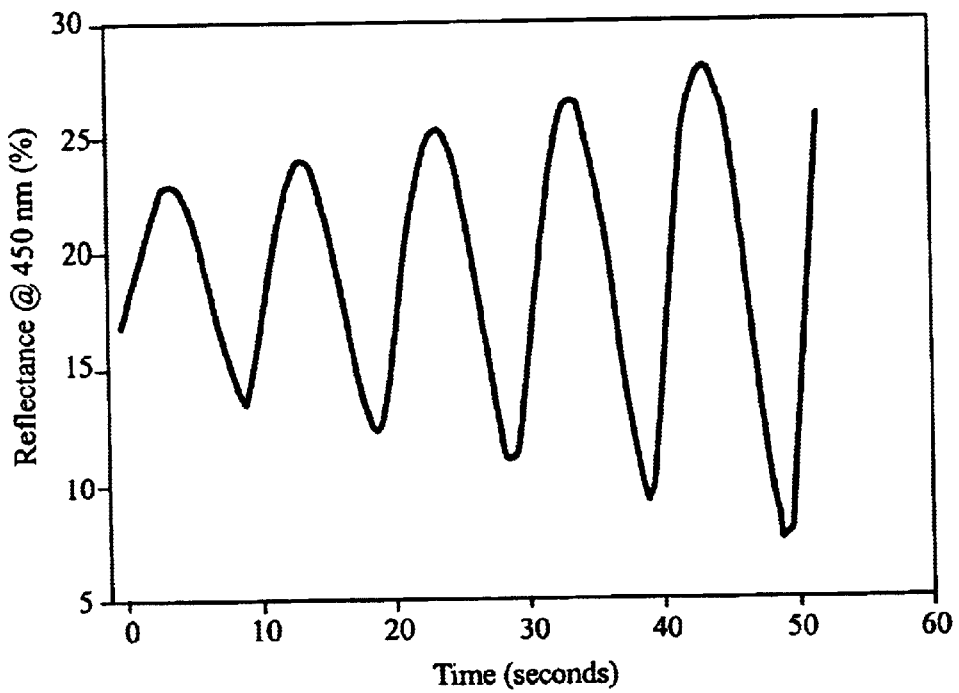
FIG. 5b shows a reflectance signal versus time measured in accord with the preferred embodiment.

Illustrative measured reflectance signals as a function of wavelength and of time at a particular wavelength are shown at FIGS. 5a and 5b, respectively. The wavelength dependence of the reflectance signal are measured according to FIG. 5a using the spectrometer 42 of FIG. 3. FIG. 5b shows the reflectance as a function of time for incident light of wavelength 450 nm. The etch rate is then extracted from the reflectance signal of FIG. 5b, as described with respect to step 3, below.

3. Fit a wafer reflectance model to the collected reflectance signal as a function of time and extract the etch rate from the model. The wafer reflectance model preferably advantageously takes into account that the reflectance signal decreases as the recess is etched, i.e., as the recess becomes deeper. This is in contrast to deep trench techniques that measure reflectance intensities from structures that are far longer or wider than a recess, and thus consistently provide a signal that is not substantially affected with attenuation based on depth. Taking into account the dampening of the reflectance signal with recess depth results in a more accurate depth and depth rate determination.

The model also preferably advantageously takes into account the etching away of any reference layer above the recess while the recess is being etched. This is advantageous since the depth of the recess is determined relative to a top reference layer. Although etching of the top reference layer occurs far more slowly than the etch rate of the recess, taking this top reference layer etching into account results in a recess etch to a more accurate depth. In contrast, the process set forth in the '761 patent includes an oxide layer actually growing above the reference layer due to deposition of oxides coming from the trench.

The model also preferably advantageously takes into account any breakthrough step that is performed when the plasma ignition occurs prior to etching the recess. The breakthrough step involves etching through an oxide or other such layer or layers prior to etching the recess. In this case, the etch start time $t_0$ is some time after the plasma ignition time. The etch start time $t_0$ is preferably determined from analysis of the reflectance data, wherein the reflectance intensity undergoes an observable change, i.e., increase, when etching of the oxide layer is completed.

4. Based on the etch rate and the etch time, predict or calculate an etch stop time $t_e$ when the recess depth calculated from the reflectance data equals the desired endpoint depth d. The etch stop time $t_e$ is preferably calculated taking into.account the etching of the top reference layer as the recess is etched.

5. Start a software timer that will trigger the endpoint at the predicted endpoint time $t_e$. Steps 3, 4, and 5 are preferably repeated after the acquisition of every new data point until the endpoint is reached. A data point is preferably extracted about every 750 msec, but is adjusted depending on the rate of etching. For example, a preferred minimum number of data points are extracted for each oscillation period in the reflectance data. The software then triggers the etching to stop at the endpoint time $t_e$. Thus, a poly recess is etched to an accurate depth in accord with the above objects of the invention.

Figure 6:
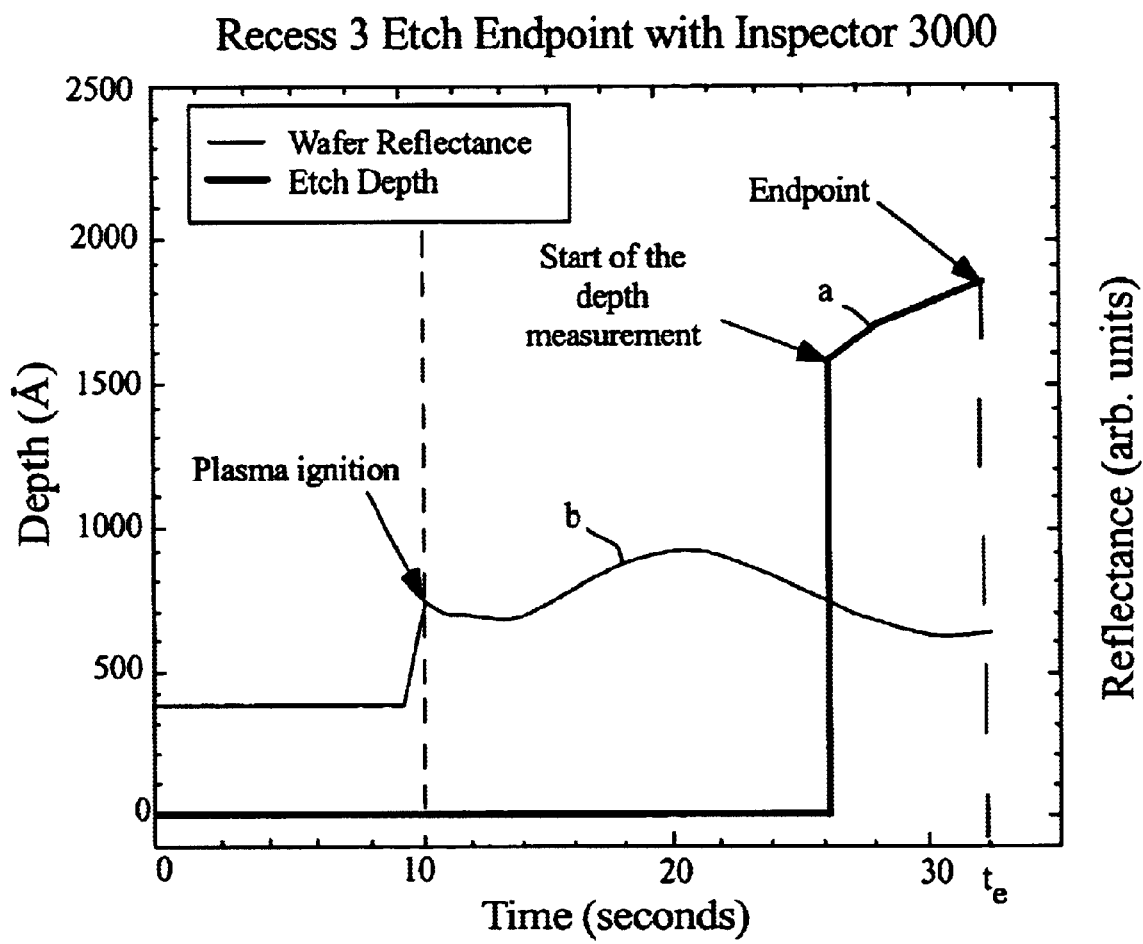
FIG. 6 shows a graph including a plot of etch depth versus time and wafer reflectance versus time during a shallow recess etch process.
Figure 7:
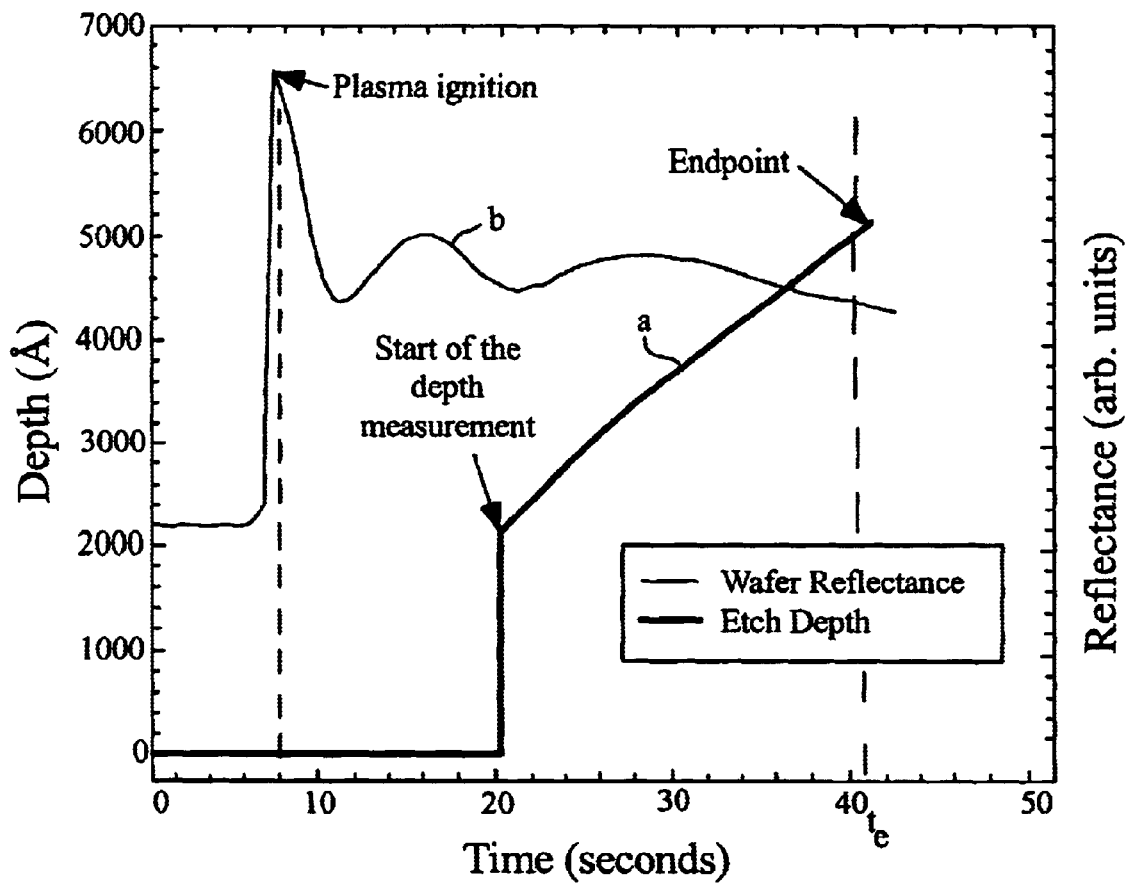
FIG. 7 shows a second graph including a plot of etch depth versus time and wafer reflectance versus time during a shallow recess etch process.

FIG. 6 shows a graph including two plots relating to a Recess 3 etch endpoint with hardware as set forth in the preferred embodiment at FIG. 3, or that may be the same as or similar to the hardware set forth in the '761 patent, incorporated by reference above (e.g., see FIGS. 6 and 7 of the '761 patent, and the description thereof in the specification). The preferred hardware including the optics and electronics may otherwise be configured as understood by those skilled in the art. One difference between the description in the '761 patent and the preferred embodiment is that an array spectrometer is used in the preferred embodiment for detecting the reflected light from the wafer, whereas a monochromatordiode or PMT detector combination spectrometer is used in the '761 patent description. The wavelength is selected in the preferred embodiment based on an analysis of the detected spectrum. Another preferred difference is that a chamber window is used that is not exactly parallel to the wafer surface so that light reflected from the window is not subsequently collected.

The first plot of FIG. 6, labeled a, is of recess depth versus time. The second plot of FIG. 6, labeled b, is of reflectance intensity versus time. The plasma ignition time at around 10 seconds is clearly observed from the reflectance data of plot b. As discussed above, an etch start time $t_0$ may correspond to the plasma ignition time, or $t_0$ may begin after a short time when a residual oxide layer is being etched away prior to beginning the recess etch. The etch start time $t_0$ is determined in this latter case by a notable change in the reflectance intensity when the residual oxide layer etching is completed and the etching of the recess begins.

Reflectance data is collected for about 15 seconds after the etch start time $t_0$ before a depth measurement is made based on the etch time and etch rate determined from the reflectance model. An endpoint or etch stop time $t_e$ is determined and etching is stopped at that time according to the method described above. As shown in plot a of FIG. 6, the endpoint occurs at a recess depth around 1800 Angstroms.

The continuous retrieval of the etch rate represents a first thread in the preferred software package of the preferred embodiment. The calculation of the etch stop time, and the ultimate triggering of the stopping of the etch process, occurs in a second thread of the software, which is updated regularly by the etch rate data.

FIG. 7 shows a graph including corresponding plots a and b (see FIG. 6) relating to Recess 2 etch endpoint. The method used in this case is substantially the same as that described above with respect to FIG. 6. In this case, however, the recess depth d at the endpoint is observed in plot a of FIG. 7 to be around 4800 Angstroms.

Figure 8:
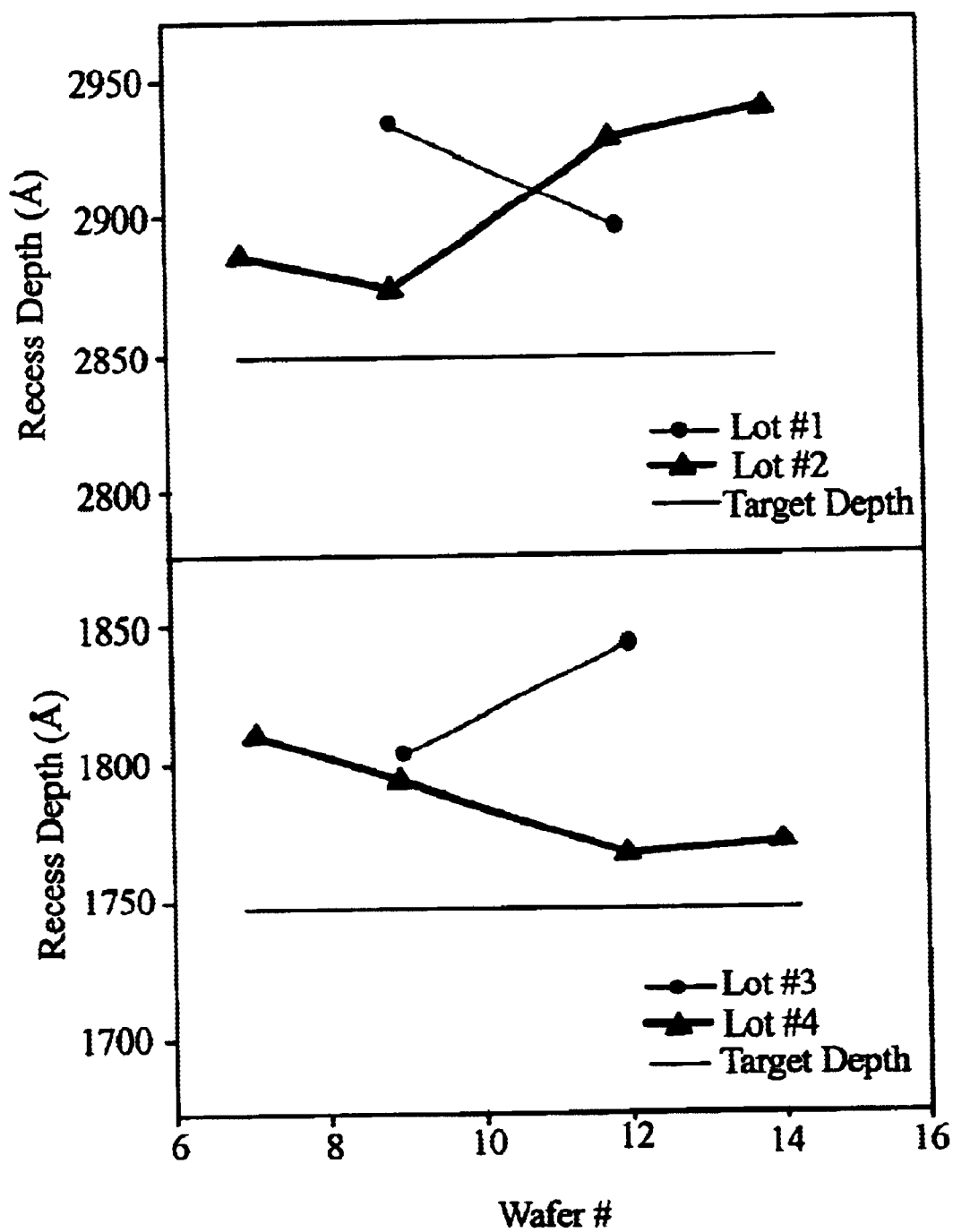
FIG. 8 shows data of actual recess depths etched in accord with the preferred embodiment compared with desired target depths.

FIG. 8 shows some exemplary results using the preferred system and method described above. For lots 1 and 2, a target depth of 2850 angstroms was set for a recess etch. The data show that depths of around 2930 and 2900 angstroms were etched for lot 1, while depths of around 2880, 2870, 2925 and 2940 angstroms were etched for lot 2. Thus, each of the recesses were etched within 3% of the target depth, well within the 6% desired tolerance. Moreover, the depths attained for lots 1 and 2 were all within 90 angstroms of the target depth. For lots 3 and 4, a target depth of 1750 angstroms was set for a recess etch. The data show that depths of around 1800 and 1850 angstroms were etched for lot 3, while depths of around 1810, 1790, 1760 and 1770 angstroms were etched for lot 4. Thus, each of the recesses were etched within the desired 6% tolerance. Moreover, the depths attained for lots 3 and 4 were all within 100 angstroms of the target depth.

Figure 9:
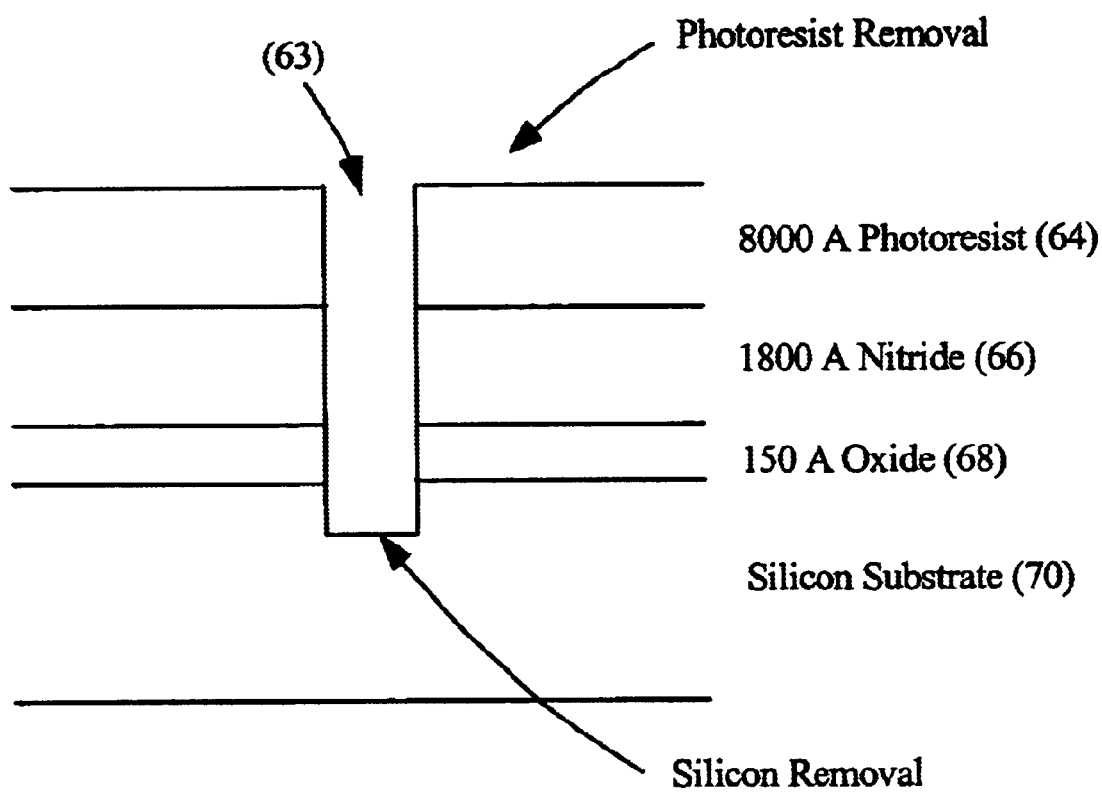
FIG. 9 shows a wafer structure including a shallow trench which may be etched in accord with the preferred embodiment.
Figure 10:
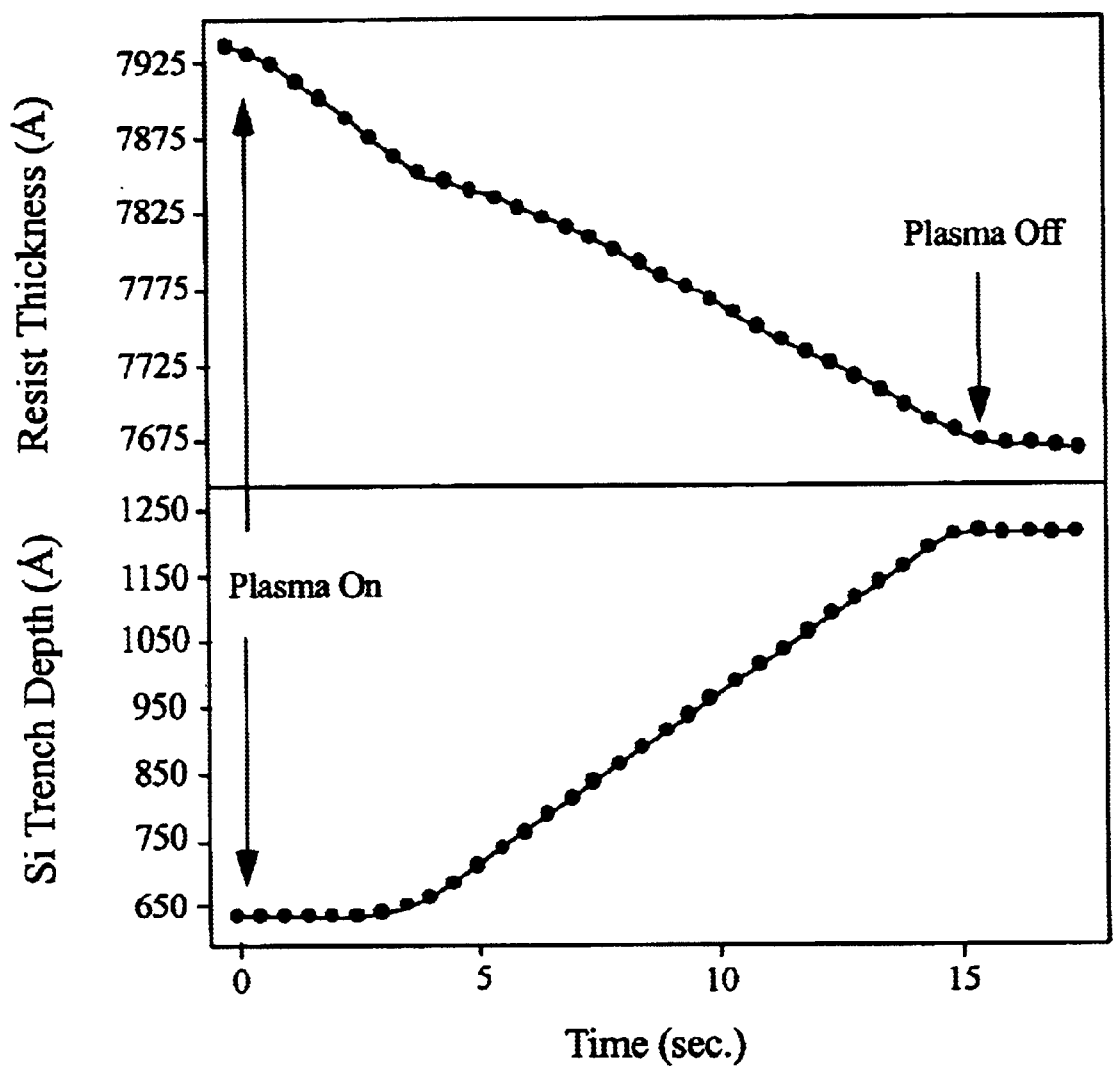
FIG. 10 illustrates how a photoresist is etched along with the silicon in a shallow trench etch process.

It is also recognized in that the preferred embodiment may be used advantageously for etching of shallow trenches. FIG. 9 schematically shows an example such a shallow trench etch process. A shallow trench 63, e.g., of depth less than 6000 angstroms, may be etched in a layer structure including a photoresist layer 64, which is over a nitride layer 66, which is over an oxide layer 68 which is over a silicon substrate 70. Some portion of the silicon is notably removed in the shallow trench etch process as illustrated at FIG. 9. Also notably, the photoresist 64 is typically etched away at a similar rate as the silicon in the trench 63, as shown at FIG. 10. Advantageously, the etching away of the photoresist is taken into account, similarly to the etching of the top reference layer as described above in the preferred method.

Figure 11A:
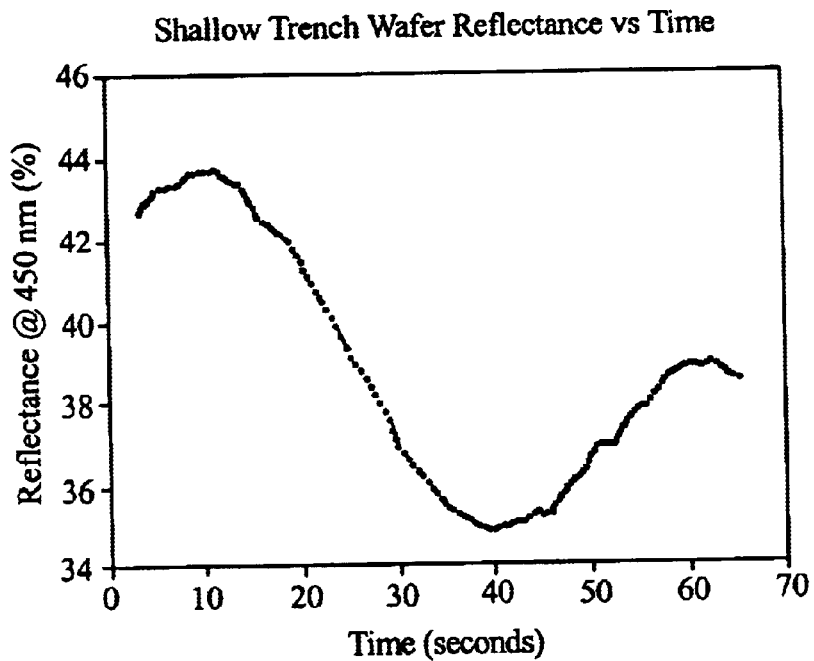
FIG. 11a shows a graph of reflectance versus time for a shallow trench etch in accord with the preferred embodiment.
Figure 11B:
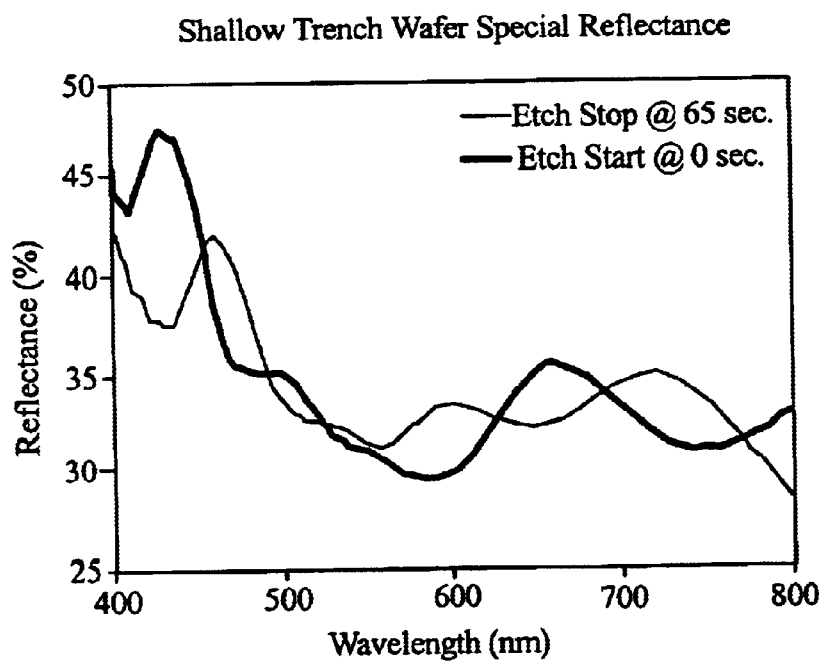
FIG. 11b shows a graph of reflectance versus wavelength for a shallow trench etch in accord with the preferred embodiment.

As in the preferred shallow recess etch process, the preferred shallow trench etch process involves measurement of spectral reflectance data, and extraction of temporal reflectance data at a selected wavelength (e.g., 450 nm), as set forth at FIGS. 11a and 11b, respectively.

It is recognized that a method and apparatus of measuring depths of structures on a substrate is disclosed at U.S. patent application Ser. No. 09/136,462, which is assigned to the same assignee and is hereby incorporated by reference into this application, as it teaches some methods and hardware arrangements which might be useful in practicing the present invention, particularly for measuring the depth and calculating an etch rate bassed on more than one such measurement during the recess etching. In contrasting the technique of the '462 Application with the present invention, the preferred embodiment of the present invention uses a measured reflectance signal versus time and a reflectance model to extract an etch rate from which an etch stop time is determined. Together with the time determined as that of the beginning of etching, a recess with an accurately determined recess depth d may be formed. In the '462 application, the reflectance signal versus wavelength is used with an interferometric analysis to determine the recess depth.

There are several advantages of using the method of the preferred embodiment for etching a shallow recess to a precise depth in accord with the above objects of the invention. The method of the preferred embodiment extracts the etching start time from the reflectance data, and knowledge of the start time is used for more precise depth measurement. The plasma ignition time or time when etching of the recess begins is extracted from the reflectance signal data. The actual plasma ignition time or etching start time is difficult to obtain in another way, for example, by communicating with the etch process controller, because the etch start time would likely not be timed precisely enough in this way for shallow recess etching applications. In addition, the recess etching start time is extracted taking account of any breakthrough step that is first performed for etching away a residual oxide layer before the recess etch actually begins, thereby preventing the residual oxide layer etching from being a source of potential error in achieving the pre-selected recess depth within tolerable accuracy.

Another advantage is that the method of the preferred embodiment removes the plasma background from the light signal. Plasma intensity variations, especially at the start of etching, may otherwise tend to obscure the depth measurement.

A further advantage of the method of the preferred embodiment is that the data is fit with a reflectance model. The model preferably describes and takes into account the increase in the recess depth, the etching of the wafer mask or top reference layer, and the attenuation/extinction of the interference signal with increasing recess depth. The rate of the wafer mask or top reference layer etching is much slower than the rate of the recess etch, but it may again tend to obscure the accuracy of the recess depth determination if not advantageously taken into account as in the preferred embodiment. The interference signal of the preferred embodiment notably decays because the light component reflected from the bottom of the recess weakens as the recess gets deeper. Since the reflectance model takes this into account, the ultimate depth determination is substantially unaffected by it.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

In addition, in the method claims that follow, the steps have been ordered in selected typographical sequences. However, the sequences have been generally selected and so ordered for typographical convenience and are not intended to imply any particular order for performing the steps, except for those claims wherein a particular ordering of steps is expressly set forth or understood by one of ordinary skill in the art as being necessary.

What is claimed is:

1. A method for plasma etching a shallow recess at a predetermined final depth of less than approximately 0.67 $\mu$m, or 15–20 or more times shallower than 10 $\mu$m deep trenches, and a width of less than approximately 0.5 $\mu$m by illuminating a wafer with a light source and using a spectrometer to receive the light reflected from the wafer, comprising the steps of:

determining an etch start time based on at least one of a plasma ignition time, a detection of a beginning of a wafer reflectance change, and a time after plasma ignition determined by observing a change of reflectance intensity in the data indicating that a breakthrough step of etching a residual oxide layer has been completed;

measuring reflectance intensities of light reflected from the wafer a number of times during said etching of said recess;

calculating an etch rate from data of the measured reflectance intensities;

calculating an etch stop time based on the etch start time, the etch rate, and the predetermined final recess depth; and triggering an endpoint such that etching is stopped approximately at the determined etch stop time, said shallow recess being etched at approximately the predetermined final recess depth within a specified tolerance of substantially 6%.

2. The method of claim 1, wherein said calculating steps include fitting said reflectance intensity data as a function of time to said model.

3. The method of claim 2, wherein said calculating steps further include factoring in an etching of a top reference layer during said etch time.

4. The method of claim 1, wherein the etch start time is a time at which the recess depth is between zero and somewhat less than the predetermined recess depth and is known with sufficient certainty such that said etch stop time may be calculated for etching a recess at the predetermined recess depth within a predetermined depth tolerance.

5. The method of claim 4, wherein the etch start time is a time at which the recess depth is approximately zero.

6. The method of claim 5, wherein the etch start time is a time of plasma ignition.

7. The method of claim 5, wherein the etch start time is a time after plasma ignition and is determined by observing an increase of reflectance intensity in the data indicating that a breakthrough step of etching a residual oxide layer has been completed.

8. The method of claim 4, wherein the etch start time is a time at which the recess depth is greater than zero.

9. The method of claim 1, further comprising a step of removing a plasma background signal from the reflectance intensity data.

10. The method of claim 1, wherein the calculating steps are performed for each of said number of times said reflectance intensities are measured.

11. The method of claim 10, wherein the calculating steps are performed for each of said number of times said reflectance intensities are measured.

12. The method of claim 1, further comprising a breakthrough step, wherein a residual layer is first etched prior to etching the recess and prior to the etch start time, and wherein the etch start time is after a plasma ignition time.

13. The method of claim 1, wherein said calculating steps include factoring in a reduction in reflectance intensity based on the depth of the recess.

14. The method of claim 1, wherein said calculating steps further include factoring in an etching of a top reference layer during said etch time.

15. The method of claim 1, wherein an array detector is used for measuring the reflectance intensity, and wherein the wavelength of the light is determined from the reflectance model.

16. The method of claim 1, further comprising a step of reflecting light away using a chamber window that is not exactly parallel to the wafer surface so that light reflected from the window is not collected.

17. A method for plasma etching a shallow recess at a predetermined final depth of less than approximately 0.67 $\mu$m, or 15–20 or more times shallower than 10 $\mu$m deep trenches, and a width of less than approximately 0.5 $\mu$m by illuminating a wafer with a light source and using a spectrometer to receive the light reflected from the wafer, comprising the steps of:

determining an etch start time;

measuring reflectance intensities of light reflected from the wafer a number of times during said etching of said recess;

calculating an etch rate from data of the measured reflectance intensities;

calculating an etch stop time based on the etch start time, the etch rate, and the predetermined final recess depth; and triggering an endpoint such that etching is stopped approximately at the determined etch stop time, whereby a shallow recess is etched at approximately the predetermined final recess depth within a specified tolerance, and the method further comprising a breakthrough step, wherein a residual layer is first etched prior to etching the recess and prior to the etch start time, and wherein the etch start time is after a plasma ignition time.

18. The method of claim 17, wherein said residual layer includes an oxide layer.

19. The method of claim 17, wherein said calculating steps include factoring a reduction in reflectance intensity with increased depth of the recess.

20. The method of claim 19, wherein said calculating steps include fitting said reflectance intensity data as a function of time to a wafer reflectance model.

21. The method of claim 20, wherein said calculating steps further include factoring in an etching of a top reference layer during said recess etching.

22. The method of claim 19, wherein said calculating steps further include factoring in an etching of a top reference layer during said recess etching.

23. The method of claim 17, wherein said calculating steps include fitting said reflectance intensity data as a function of time to a wafer reflectance model.

24. The method of claim 23, wherein said calculating steps further include factoring in an etching of a top reference layer during said recess etching.

25. The method of claim 17, wherein said calculating steps further include factoring an etching of a top reference layer during said etch time.

26. A method for plasma etching a shallow recess at a predetermined final depth of less than approximately 0.67 $\mu$m, or 15–20 or more times shallower than 10 $\mu$m deep trenches, and a width of less than approximately 0.5 $\mu$m by illuminating a wafer with a light source and using a spectrometer to receive the light reflected from the wafer, comprising the steps of:

determining an etch start time;

measuring reflectance intensities of light reflected from the wafer a number of times during said etching of said recess;

calculating an etch rate from data of the measured reflectance intensities;

calculating an etch stop time based on the etch start time, the etch rate, and the predetermined final recess depth; and triggering an endpoint such that etching is stopped approximately at the determined etch stop time, whereby a shallow recess is etched at approximately the predetermined final recess depth within a specified tolerance, wherein said calculating steps include factoring in a reduction in reflectance intensity based on the depth of the recess.

27. The method of claim 26, wherein said reflectance intensity reduction is factored in as a substantially exponential intensity reduction with recess depth.

28. The method of claim 26, wherein said calculating steps further include fitting said data to a wafer reflectance model, such that said etch rate is extracted from the model.

29. The method of claim 28, wherein said calculating steps include fitting said reflectance intensity data as a function of time to said model.

30. The method of claim 29, wherein said calculating steps further include factoring in an etching of a top reference layer during said etch time.

31. The method of claim 26, wherein said calculating steps further include factoring in an etching of a top reference layer during said etch time.

32. A method for plasma etching a shallow recess at a predetermined final depth of less than approximately 0.67 $\mu$m, or 15–20 or more times shallower than 10 $\mu$m deep trenches, and a width of less than approximately 0.5 $\mu$m by illuminating a wafer with a light source and using a spectrometer to receive the light reflected from the wafer, comprising the steps of:

determining an etch start time;

measuring reflectance intensities of light reflected from the wafer a number of times during said etching of said recess;

calculating an etch rate from data of the measured reflectance intensities;

calculating an etch stop time based on the etch start time, the etch rate, and the predetermined final recess depth; and triggering an endpoint such that etching is stopped approximately at the determined etch stop time, whereby a shallow recess is etched at approximately the predetermined final recess depth within a specified tolerance, wherein said calculating steps further include factoring in an etching of a top reference layer during said etch time.

33. The method of claim 32, wherein the predetermined depth tolerance is around 6%.

34. A method for plasma etching a shallow recess at a predetermined final depth of less than approximately 0.67 $\mu$m, or 15–20 or more times shallower than 10 $\mu$m deep trenches, and a width of less than approximately 0.5 $\mu$m by illuminating a wafer with a light source and using a spectrometer to receive the light reflected from the wafer, comprising the steps of:

determining an etch start time;

measuring reflectance intensities of light reflected from the wafer a number of times during said etching of said recess;

calculating an etch rate from data of the measured reflectance intensities;

calculating an etch stop time based on the etch start time, the etch rate, and the predetermined final recess depth; and triggering an endpoint such that etching is stopped approximately at the determined etch stop time, whereby a shallow recess is etched at approximately the predetermined final recess depth within a specified tolerance, wherein an array detector is used for measuring the reflectance intensity, and wherein the wavelength of the light is determined from the reflectance model.

35. A method for plasma etching a shallow recess at a predetermined final depth of less than approximately 0.67 $\mu$m, or 15–20 or more times shallower than 10 $\mu$m deep trenches, and a width of less than approximately 0.5 $\mu$m by illuminating a wafer with a light source and using a spectrometer to receive the light reflected from the wafer, comprising the steps of:

determining an etch start time;

measuring reflectance intensities of light reflected from the wafer a number of times during said etching of said recess;

calculating an etch rate from data of the measured reflectance intensities;

calculating an etch stop time based on the etch start time, the etch rate, and the predetermined final recess depth;

triggering an endpoint such that etching is stopped approximately at the determined etch stop time, whereby a shallow recess is etched at approximately the predetermined final recess depth within a specified tolerance; and reflecting light away using a chamber window that is not exactly parallel to the wafer surface so that light reflected from the window is not collected.

36. A method for plasma etching a shallow trench at a predetermined final depth of less than approximately 0.6 μm by illuminating a wafer with a light source and using a spectrometer to receive the light reflected from the wafer, comprising the steps of:

determining an etch start time based on at least one of a plasma ignition time, a detection of a beginning of a wafer reflectance change, and a time after plasma ignition determined by observing a change of reflectance intensity in the data indicating that a breakthrough step of etching a residual oxide layer has been completed;

measuring reflectance intensities of light reflected from the wafer a number of times during said etching of said trench;

calculating an etch rate from data of the measured reflectance intensities;

calculating an etch stop time based on the etch start time, the etch rate, and the predetermined final trench depth; and triggering an endpoint such that etching is stopped approximately at the determined etch stop time, said shallow trench being etched at approximately the predetermined final trench depth within a specified tolerance of substantially 6%.

37. The method of claim 36, wherein said calculating steps include fitting said reflectance intensity data as a function of time to said model.

38. The method of claim 37, wherein said calculating steps further include factoring in an etching of a top reference layer during said etch time.

39. The method of claim 36, wherein the etch start time is a time at which the trench depth is between zero and somewhat less than the predetermined trench depth and is known with sufficient certainty such that said etch stop time may be calculated for etching a trench at the predetermined trench depth within a predetermined depth tolerance.

40. The method of claim 39, wherein the predetermined depth tolerance is around 6%.

41. The method of claim 39, wherein the etch start time is a time at which the trench depth is approximately zero.

42. The method of claim 41, wherein the etch start time is a time of plasma ignition.

43. The method of claim 41, wherein the etch start time is a time after plasma ignition and is determined by observing an increase of reflectance intensity in the data indicating that a breakthrough step of etching a residual oxide layer has been completed.

44. The method of claim 39, wherein the etch start time is a time at which the trench depth is greater than zero.

45. The method of claim 36, further comprising a step of removing a plasma background signal from the reflectance intensity data.

46. A method for plasma etching a shallow trench at a predetermined final depth of less than approximately 0.6 μm by illuminating a wafer with a light source and using a spectrometer to receive the light reflected from the wafer, comprising the steps of:

determining an etch start time;

measuring reflectance intensities of light reflected from the wafer a number of times during said etching of said trench;

calculating an etch rate from data of the measured reflectance intensities;

calculating an etch stop time based on the etch start time, the etch rate, and the predetermined final trench depth; and triggering an endpoint such that etching is stopped approximately at the determined etch stop time, whereby a shallow trench is etched at approximately the predetermined final trench depth within a specified tolerance of substantially 6%, and the method further comprising a breakthrough step, wherein a residual layer is first etched prior to etching the trench and prior to the etch start time, and wherein the etch start time is after a plasma ignition time.

47. The method of claim 46, wherein said residual layer includes an oxide layer.

48. The method of claim 47, wherein said calculating steps include factoring a reduction in reflectance intensity with increased depth of the trench.

49. The method of claim 48, wherein said calculating steps include fitting said reflectance intensity data as a function of time to a wafer reflectance model.

50. The method of claim 49, wherein said calculating steps further include factoring in an etching of a top reference layer during said trench etching.

51. The method of claim 48, wherein said calculating steps further include factoring in an etching of a top reference layer during said trench etching.

52. The method of claim 46, wherein said calculating steps include fitting said reflectance intensity data as a function of time to a wafer reflectance model.

53. The method of claim 52, wherein said calculating steps further include factoring in an etching of a top reference layer during said trench etching.

54. The method of claim 46, wherein said calculating steps further include factoring an etching of a top reference layer during said etch time.

55. A method for plasma etching a shallow trench at a predetermined final depth of less than approximately 0.6 μm by illuminating a wafer with a light source and using a spectrometer to receive the light reflected from the wafer, comprising the steps of:

determining an etch start time;

measuring reflectance intensities of light reflected from the wafer a number of times during said etching of said trench;

calculating an etch rate from data of the measured reflectance intensities;

calculating an etch stop time based on the etch start time, the etch rate, and the predetermined final trench depth; and triggering an endpoint such that etching is stopped approximately at the determined etch stop time, whereby a shallow trench is etched at approximately the predetermined final trench depth within a specified tolerance of substantially 6%, wherein said calculating steps include factoring in a reduction in reflectance intensity based on the depth of the trench.

56. The method of claim 55, wherein said reflectance intensity reduction is factored in as a substantially exponential intensity reduction with trench depth.

57. The method of claim 55, wherein said calculating steps further include fitting said data to a wafer reflectance model, such that said etch rate is extracted from the model.

58. The method of claim 57, wherein said calculating steps include fitting said reflectance intensity data as a function of time to said model.

59. The method of claim 58, wherein said calculating steps further include factoring in an etching of a top reference layer during said etch time.

60. The method of claim 55, wherein said calculating steps further include factoring in an etching of a top reference layer during said etch time.

61. A method for plasma etching a shallow trench at a predetermined final depth of less than approximately 0.6 $\mu$m by illuminating a wafer with a light source and using a spectrometer to receive the light reflected from the wafer, comprising the steps of:

determining an etch start time;

measuring reflectance intensities of light reflected from the wafer a number of times during said etching of said trench;

calculating an etch rate from data of the measured reflectance intensities;

calculating an etch stop time based on the etch start time, the etch rate, and the predetermined final trench depth; and triggering an endpoint such that etching is stopped approximately at the determined etch stop time, whereby a shallow trench is etched at approximately the predetermined final trench depth within a specified tolerance of substantially 6%, wherein said calculating steps further include factoring in an etching of a top reference layer during said etch time.

62. A method for plasma etching a shallow trench at a predetermined final depth of less than approximately 0.6 $\mu$m by illuminating a wafer with a light source and using a spectrometer to receive the light reflected from the wafer, comprising the steps of:

determining an etch start time;

measuring reflectance intensities of light reflected from the wafer a number of times during said etching of said trench;

calculating an etch rate from data of the measured reflectance intensities;

calculating an etch stop time based on the etch start time, the etch rate, and the predetermined final trench depth; and triggering an endpoint such that etching is stopped approximately at the determined etch stop time, whereby a shallow trench is etched at approximately the predetermined final trench depth within a specified tolerance of substantially 6%, wherein an array detector is used for measuring the reflectance intensity, and wherein the wavelength of the light is determined from the reflectance model.

63. A method for plasma etching a shallow trench at a predetermined final depth of less than approximately 0.6 $\mu$m by illuminating a wafer with a light source and using a spectrometer to receive the light reflected from the wafer, comprising the steps of:

determining an etch start time;

measuring reflectance intensities of light reflected from the wafer a number of times during said etching of said trench;

calculating an etch rate from data of the measured reflectance intensities;

calculating an etch stop time based on the etch start time, the etch rate, and the predetermined final trench depth;

triggering an endpoint such that etching is stopped approximately at the determined etch stop time, whereby a shallow trench is etched at approximately the predetermined final trench depth within a specified tolerance of substantially 6%; and reflecting light away using a chamber window that is not exactly parallel to the wafer surface so that light reflected from the window is not collected.

* * * * *